(12) United States Patent
Lee et al.

(10) Patent No.: US 7,648,854 B2
(45) Date of Patent: Jan. 19, 2010

(54) METHODS OF FORMING METAL OXIDE LAYERS, METHODS OF FORMING GATE STRUCTURES USING THE SAME, AND METHODS OF FORMING CAPACITORS USING THE SAME

(75) Inventors: Jung-Ho Lee, Gyeonggi-do (KR); Jun-Hyun Cho, Gyeonggi-do (KR); Youn-Joung Cho, Gyeonggi-do (KR); Seung-Min Ryu, Busan (KR); Kyoo-Chul Cho, Gyeonggi-do (KR); Jung-Sik Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 11/985,672

(22) Filed: Nov. 16, 2007

(65) Prior Publication Data

US 2008/0213940 A1    Sep. 4, 2008

(30) Foreign Application Priority Data

Nov. 17, 2006    (KR)    ............... 10-2006-0113747

(51) Int. Cl.
| | |
|---|---|
| H01L 21/00 | (2006.01) |
| H01L 21/16 | (2006.01) |
| H01L 21/20 | (2006.01) |
| H01L 21/31 | (2006.01) |
| H01L 21/469 | (2006.01) |

(52) U.S. Cl. ............... 438/104; 438/393; 438/396; 438/785; 257/E21.09

(58) Field of Classification Search ......... 438/104, 438/393, 396, 785; 257/E21.09
See application file for complete search history.

(56) References Cited

U.S. PATENT DOCUMENTS

| | | | | |
|---|---|---|---|---|
| 6,753,245 | B2 * | 6/2004 | Choi | 438/613 |
| 6,969,539 | B2 * | 11/2005 | Gordon et al. | 427/255.29 |
| 6,984,591 | B1 | 1/2006 | Buchanan et al. | 438/788 |
| 2005/0008781 | A1 * | 1/2005 | Jones | 427/255.31 |
| 2006/0115595 | A1 * | 6/2006 | Shenai-Khatkhate et al. | 427/248.1 |
| 2006/0157863 | A1 * | 7/2006 | Marsh | 257/774 |
| 2006/0166512 | A1 * | 7/2006 | Lee et al. | 438/785 |
| 2007/0154637 | A1 * | 7/2007 | Shenai-Khatkhate et al. | 427/248.1 |
| 2008/0268151 | A1 * | 10/2008 | Choi | 427/250 |

FOREIGN PATENT DOCUMENTS

| | | |
|---|---|---|
| KR | 0532960 | 11/2005 |
| KR | 1020060084503 | 7/2006 |

* cited by examiner

*Primary Examiner*—Alexander G Ghyka
*Assistant Examiner*—Seahvosh J Nikmanesh
(74) *Attorney, Agent, or Firm*—Myers Bigel Sibley & Sajovec, PA

(57) ABSTRACT

Provided herein are methods of forming a metal oxide layer that include providing an organometallic compound and an oxidizing agent to the substrate to form the metal oxide layer on the substrate. The organometallic compound may have the general formula of $M(NR^1R^2)_3R^3$, wherein M is a metal; $R^1$ and $R^2$ are each independently hydrogen or alkyl; and $R^3$ is selected from the group consisting of alkyl, cycloalkyl, heterocycloalkyl, aryl and heteroaryl.

19 Claims, 11 Drawing Sheets

US 7,648,854 B2

METHODS OF FORMING METAL OXIDE LAYERS, METHODS OF FORMING GATE STRUCTURES USING THE SAME, AND METHODS OF FORMING CAPACITORS USING THE SAME

CROSS-REFERENCE TO RELATED APPLICATIONS

This application claims priority under 35 USC § 119 to Korean Patent Application No. 2006-113747, filed on Nov. 17, 2006 in the Korean Intellectual Property Office (KIPO), the contents of which are herein incorporated by reference in their entirety.

FIELD OF THE INVENTION

The present invention relate to a semiconductor devices and methods of manufacturing the same. More particularly, the present invention relates to metal oxide layers that may be used in semiconductor devices and methods of making the same.

BACKGROUND OF THE INVENTION

As semiconductor devices become more highly integrated, the size of cell regions in the semiconductor devices are being reduced. Accordingly, forming a capacitor having a capacitance sufficient for stable operation of a cell may be difficult. The capacitance "C" of a capacitor is directly proportional to the dielectric constant "$\epsilon$" ($\epsilon=\epsilon_o\epsilon_r$) of a dielectric layer and the area "A" of the electrodes, and is inversely proportional to the distance "d" between the electrodes, as shown by the following equation.

$$C=\epsilon A/d$$

For capacitors formed using a conventional dielectric material such as silicon oxide or silicon nitride, methods of forming cylindrical-shaped or fin-type lower electrodes have been developed to increase the effective area of the capacitor, thereby increasing the capacitance. However, forming an electrode having such a complicated shape may be difficult.

In order to address the above-mentioned problems, methods of forming a dielectric layer using a material having a relatively high dielectric constant have been investigated. For example, metal oxides having a relatively high dielectric constant, such as aluminum oxide ($Al_2O_3$), tantalum oxide ($Ta_2O_5$), niobium oxide ($Nb_2O_5$), zirconium dioxide ($ZrO_2$), titanium dioxide ($TiO_2$), and the like, have been developed for use as the dielectric material between the electrodes of a capacitor for a DRAM device in the gigabyte class. The dielectric constants of the above-mentioned materials are in a range of about 10 to about 114, which is about 2.5 to 30 times as large as the dielectric constant (3.9) of silicon oxide ($SiO_2$).

Generally, a thin film such as a dielectric layer may be deposited by a process such as a chemical vapor deposition (CVD) process, a low-pressure CVD (LPCVD) process, a plasma-enhanced CVD (PECVD) process or a sputtering process. When a process for forming a thin film using CVD is performed, the thin film may be formed at a relatively high temperature and thus a device including the thin film may be disadvantageously affected by the elevated temperature. Additionally, a thin film formed by a CVD process may have an irregular thickness and may have poor step coverage characteristics.

In contrast, atomic layer deposition (ALD) processes are generally performed at a temperature lower than that of CVD processes, and thin films formed by ALD processes may have suitable composition characteristics, relatively uniform thickness and desirable step coverage characteristics. Thus, ALD processes may be desirable for forming gate oxide layers and/or dielectric layers of a capacitor having a high dielectric constant.

A typical ALD process may include the following steps. First, a first source gas including a first element may be introduced into a chamber so that the first element gas may be chemically adsorbed (chemisorbed) onto a substrate. The remaining portion of the first source gas in the chamber that has not been chemisorbed onto the surface may then be purged by an inert gas. Next, a second source gas including a second element may be introduced into the chamber so that the first element chemisorbed onto the substrate and the second source gas may react with each other to form a layer including the first and second elements. Then, a unreacted portion of the second source gas in the chamber and the by-products generated by the reaction are purged by an inert gas. The above processes may be repeatedly performed until a thin film with the desired thickness is formed.

Precursors used in ALD processes should desirably have the following characteristics. First, the precursor should have a relatively high saturated vapor pressure and should be relatively chemically and thermally stable. Second, ligands bonded to a metal should dissociate relatively quickly and completely. Third, organic materials from the precursor should be absent or minimal in the final thin film. Fourth, the precursor should be relatively nontoxic and in a liquid state at room temperature. Fifth, the precursor should deposited at a relatively high deposition rate. Sixth, the precursor should have a relatively high purity and a relatively low cost.

Conventional precursors, such as alkyl metals, metal alkoxides, metal halides, $\beta$-diketonates, may not have all of the above-mentioned characteristics. For example, an alkyl metal precursor such as $Pb(C_2H_5)_4$ has been shown to be toxic and explosive. Additionally, some metal alkoxide precursors may be sensitive to moisture, and thus a metal included in the metal alkoxide may easily combine with hydrogen or a hydroxyl group so that undesirable impurities such as metal hydroxide may be included in the metal oxide layer. Furthermore, $\beta$-diketonate precursors, which may be relatively expensive, may have a relatively low saturated vapor pressure and may be solid at room temperature, which may result in difficulties in processing. Beta-diketonate precursors, such as a hexafluoropentanedionate precursor and a heptafluorodimethyloctanedionate precursor, that have improved volatility have also been studied. However, ligands included in such precursors may not readily dissociate from the metal in the precursors because the reactivity of the precursors is relatively low. Additionally, the deposition rate of the precursors is low because the precursors have a relatively high molecular weight.

Tetrakis ethylmethylamino hafnium (TEMAH, $Hf[N(CH_3)(C_2H_5)]_4$) and tetrakis ethylmethylamino zirconium (TEMAZ, $Zr[N(CH_3)(C_2H_5)]_4$), which have also been studied, may be relatively thermally unstable so that mass production of such precursors may be difficult.

SUMMARY OF THE INVENTION

Provided according to some embodiments of the invention are methods of forming a metal oxide layer. In some embodiments, the methods include providing an organometallic compound to a substrate; and providing an oxidizing agent to the substrate to form the metal oxide layer on the substrate.

In some embodiments of the invention, the organometallic compound has the formula

wherein M is a metal; $R^1$ and $R^2$ are each independently hydrogen or alkyl; and $R^3$ is selected from the group consisting of alkyl, cycloalkyl, heterocycloalkyl, aryl and heteroaryl. In particular embodiments, $R^1$ and $R^2$ may each independently be hydrogen or $C_1$-$C_5$ alkyl, and $R^3$ may be $C_1$-$C_5$ alkyl, hetrocycloalkyl, aryl or heteroaryl, wherein the heterocycloalkyl, aryl or heteroaryl may be unsubstituted or substituted at least one of a methyl, ethyl and/or t-butyl. In particular embodiments, the organometallic compound includes at least one of $CpZr(N(CH_3)(C_2H_5))_3$, $CpHf(N(CH_3)(C_2H_5))_3$ and $CpTi(N(CH_3)(C_2H_5))_3$.

In some embodiments of the invention, the oxidizing agent includes at least one of ozone, plasma $O_2$, remote plasma $O_2$, plasma $N_2O$ and $H_2O$.

In some embodiments of the invention, the metal oxide includes at least one metal oxide selected from the group consisting of $TiO_2$, $ZrO_2$, and $HfO_2$.

Methods forming a metal oxide layers according to embodiments of the invention may also include (i) providing an organometallic compound according to an embodiment of the invention to a substrate; (ii) chemisorbing at least a portion of the organometallic compound to the substrate; (iii) removing any organometallic compound that is not chemisorbed to the substrate; (iv) providing an oxidizing agent to the substrate; (v) chemically reacting the organometallic compound with the oxidizing agent, thereby dissociating at least one ligand from the organometallic compound and forming the metal oxide layer; and (vi) removing unreacted oxidizing agent and dissociated ligand from the substrate. In some embodiments, steps (i) through (vi) are repeated at least once.

Furthermore, in some embodiments of the invention, the steps of providing the organometallic compound to the substrate and providing the oxidizing agent to the substrate are each performed at a temperature in a range of about 200° C. to about 400° C. and at a pressure in a range of about 0.1 torr to about 10 torr.

In some embodiments of the invention, providing the organometallic compound to the substrate includes providing a carrier gas and the organometallic compound to the substrate.

In some embodiments of the invention, the organometallic compound is at a temperature in a range of about 40° C. to about 120° C. prior to being provided to the substrate.

In some embodiments of the invention, the steps of removing any organometallic compound that is not chemisorbed to the substrate and removing unreacted oxidizing agent and dissociated ligand from the substrate both include providing an inert gas to the substrate.

In some embodiments of the invention, the methods further include performing a heat treatment process in an oxygen atmosphere to the substrate after removing unreacted oxidizing agent and dissociated ligand from the substrate.

In some embodiments of the invention, methods further include forming an aluminum oxide layer on the substrate prior to providing the organometallic compound to the substrate, wherein forming an aluminum oxide layer includes providing an aluminum compound and an oxidizing agent. In some embodiments, the aluminum compound includes at least one of trimethyl aluminum, triethyl aluminum, triisobutyl aluminum and diethylaluminum chloride.

In some embodiments of the invention, provided are methods of forming a gate structure. Methods of forming a gate structure may include (i) providing an organometallic compound to a substrate; (ii) providing an oxidizing agent to the substrate to form a gate insulation layer including a metal oxide; (iii) forming a gate conductive layer on the gate insulation layer; and (iv) patterning the gate conductive layer and the gate insulation layer to form the gate structure including a gate insulation layer pattern and a gate conductive pattern on the substrate.

Also provided according to embodiments of the present invention are methods of forming a capacitor. Methods of forming a capacitor may include (i) forming a lower electrode on a substrate; (ii) providing an organometallic compound to the lower electrode; (iii) providing an oxidizing agent to the lower electrode to form a dielectric layer including a metal oxide; and (iv) forming an upper electrode on the dielectric layer.

BRIEF DESCRIPTION OF THE DRAWINGS

The above and other features and advantages of the present invention will become more apparent by describing in detail example embodiments thereof with reference to the accompanying drawings, in which.

DETAILED DESCRIPTION OF EMBODIMENTS OF THE INVENTION

Figure 1:
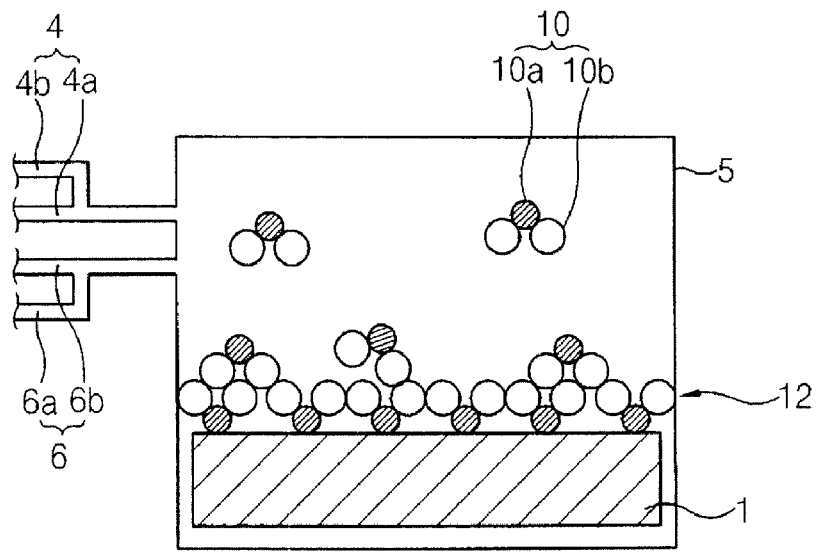
FIGS. 1 to 4 are cross-sectional views illustrating methods of forming a metal oxide layer in accordance with some embodiments of the present invention.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods of Forming Metal Oxide Layers

FIGS. 1 to 4 are cross-sectional views illustrating methods of forming a metal oxide layer in accordance with some embodiments of the present invention.

Referring to FIG. 1, a substrate 1 may be placed in a chamber 5, which is maintained at a temperature in a range of about 200° C. to about 500° C. In some embodiments, the substrate 1 may include a silicon wafer. When the temperature of the chamber 5 is lower than about 200° C., an organometallic compound therein may not be in a gaseous state, which may result in process difficulties, and further, the organometallic compound may not be suitably reactive. Additionally, when the temperature of the chamber 5 is higher than 500° C., reactants therein may decompose, which may undesirable for forming atomic layers and thin films. Therefore, in some embodiments, the chamber 5 has a temperature in a range of about 250° C. to about 400° C.

When the inner pressure of the chamber 5 is lower than about 0.1 torr, reactants may have low reactivity in the processes described herein. Additionally, when the inner pressure of the chamber 5 is higher than about 10.0 torr, process control may be difficult. Therefore, in some embodiments, the chamber 5 may be adjusted to have an inner pressure in a range of about 0.1 torr to about 10.0 torr. In particular embodiments, the inner pressure of the chamber 5 may be in a range of about 0.5 torr to about 3.0 torr.

The chamber 5 may have supply lines 4 and 6 providing gases into the chamber 5. In some embodiments of the present invention, a first supply line 4 includes a first branch supply line 4a and a second branch supply line 4b. In some embodiments, an organometallic compound 10 may be provided into the chamber 5 through the first branch supply line 4a in a deposition process, and a first inactive gas (also referred to as an inert gas) may be provided into the chamber 5 through the second branch supply line 4b. The first inactive gas may purge the chamber 5 of the organometallic compound 10 and prevent the organometallic compound 10 from flowing backward into the first supply line 4 during a process described herein.

In some embodiments, a second supply line 6 may include a third branch supply line 6a and a fourth branch supply line 6b. An oxidizing agent 20 (See FIG. 3) may be provided into the chamber 5 through the third branch supply line 6a in a deposition process, and a second inactive gas may be provided into the chamber 5 through the fourth branch supply line 6b. The second inactive gas (also referred to as an inert gas) may purge the chamber 5 of the oxidizing agent 20, and prevent the oxidizing agent 20 from flowing backward into the second supply line 6 during a process described herein. Hereinafter, the portions of the first and second inactive gases that are provided into the chamber 5 to purge the chamber 5 of the organometallic compound and the oxidizing agent will be referred to as "purge gas," and portions of the first and second inactive gases that are provided into the chamber 5 to prevent the organometallic compound and the oxidizing agent from flowing backward into the supply lines will be referred to as "backflow prevention gas."

In some embodiments, the organometallic compound 10 may be introduced into the chamber 5 having the above-mentioned temperature and pressure conditions through the first branch supply line 4a of the first supply line 4. The organometallic compound 10 may be provided into the chamber 5 using an inactive gas, such as argon (Ar) or nitrogen ($N_2$), as the carrier gas. The organometallic compound 10 may include a central metal 10a and at least one ligand 10b bonded to the central metal 10a. In some embodiments, the carrier gas may be provided at a flow rate in a range of about 200 sccm to about 5,000 sccm. In particular embodiments, the carrier gas may be provided at a flow rate in a range of about 500 sccm to about 2,000 sccm.

In some embodiments of the invention, the organometallic compound 10 may be expressed by the following formula:

wherein "M" represents a central metal and "$(NR^1R^2)_3R^3$" represents the ligands (also collectively referred to herein as "ligand"). Here, $R^1$ and $R^2$ may each independently be hydrogen or a straight chain or branched alkyl group. In particular embodiments, $R^1$ and $R^2$ may each independently be hydrogen or an alkyl having one to five carbon atoms ("$C_1$-$C_5$ alkyl"). As such, $R^1$ and $R^2$ may be identical or different from each other. $R^3$ may be alkyl (straight chain or branched), cycloalkyl, heterocycloalkyl, aryl or heteroaryl. In particular embodiments, the alkyl may be a $C_1$-$C_5$ alkyl and the aryl may have 5 or more carbon atoms. Furthermore, the cycloalkyl, heterocycloalkyl, aryl or heteroaryl may be unsubstituted or may be substituted with at least one alkyl group (such as a methyl, ethyl or t-butyl). In some embodiments, each available carbon atom of the cycloalkyl, heterocycloalkyl, aryl or heteroaryl may be substituted.

While the organometallic compound 10 may be provided to the chamber 5 through the first branch supply line 4a, in some embodiments, a backflow prevention gas may be provided to the chamber 5 through the fourth branch supply line 6b of the second supply line 6. The backflow prevention gas may prevent the organometallic compound 10 from flowing backward into the second supply line 6.

In some embodiments of the present invention, the organometallic compound 10 may be introduced into the chamber 5 (and to the substrate 1) for a time in a range of about 0.2 seconds to about 10 seconds, and at a flow rate in a range of about 500 sccm to about 1,000 sccm. In some embodiments, the temperature of the organometallic compound 10 may be maintained at a temperature in a range of about 40° C. to about 120° C. in a canister outside of the chamber 5, and thus the organometallic compound 10 may be in a liquid state. The organometallic compound 10 may then be evaporated in the chamber 5, and thus may be in a gaseous state therein.

In some embodiments, the central metal 10a included in the organometallic compound 10 may include a Group 4 metal. For example, the central metal 10a may include titanium (Ti), zirconium (Zr), hafnium (Hf), and the like.

In some embodiments, the organometallic compound 10 may include $CpZr(N(CH_3)(C_2H_5))_3$, $CpHf(N(CH_3)(C_2H_5))_3$, $CpTi(N(CH_3)(C_2H_5))_3$, and the like, wherein Cp represents cyclopentadienyl. Mixtures of different organometallic compounds may also be used.

The flow rate of the organometallic compound 10 and the time for providing the organometallic compound 10 to the chamber 5 may be varied depending on the specific organometallic compound 10. However, in particular embodiments, the organometallic compound 10 may be provided to the chamber 5 at a flow rate in a range of about 500 sccm to about 1,000 sccm for a time in a range of about 3 seconds to about 10 seconds.

When the organometallic compound 10 is provided into the chamber 5, the central metal 10a may become chemisorbed to the substrate 1. Accordingly, a chemisorbed layer 12 including the organometallic compound 10 may be formed on the substrate 1. Here, a portion of the organometallic compound 10 that has not been chemisorbed to the substrate 1 may be physically adsorbed (physisorbed) to the chemisorbed layer 12 and so loosely combined therewith. A portion of the organometallic compound may also drift in the chamber 5.

The portion of the organometallic compound 10 that has been chemisorbed to the substrate 1 may be thermally decomposed by the heat in the chamber 5. Thus, a portion of the ligand 10b bonded to the central metal 10a may become dissociated from the central metal 10a.

Figure 2:
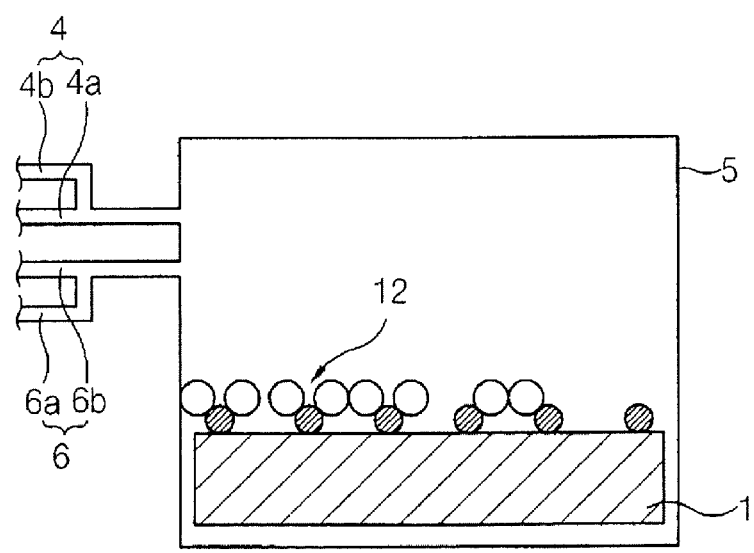

Referring to FIG. 2, an inert gas such as argon, nitrogen, etc. may be provided to the chamber 5 through the second branch supply line 4b of the first supply line 4 to purge the chamber 5. In some embodiments, the chamber 5 may be purged for a time in a range of about 1 second to about 30 seconds. In particular embodiments, the chamber 5 may be purged for a time in a range of about 2 seconds to about 20 seconds.

While the purge gas may be provided through the second branch supply line 4b, a backflow prevention gas may be provided into the chamber 5 through the fourth branch supply line 6b of the second supply line 6. The backflow prevention gas may prevent organometallic compound 10 that has not been chemisorbed to the substrate 1 and ligand 10b that has been dissociated from the central metal 10a from flowing backward into the second supply line 6.

The portion of the organometallic compound 10 that has not been chemisorbed to the substrate 1 and the portion of the ligand 10b that has been dissociated from the central metal 10a may thus be removed from the chamber 5. Therefore, the chemisorbed layer 12 including the organometallic compound 10 may remain on the substrate 1.

Figure 3:
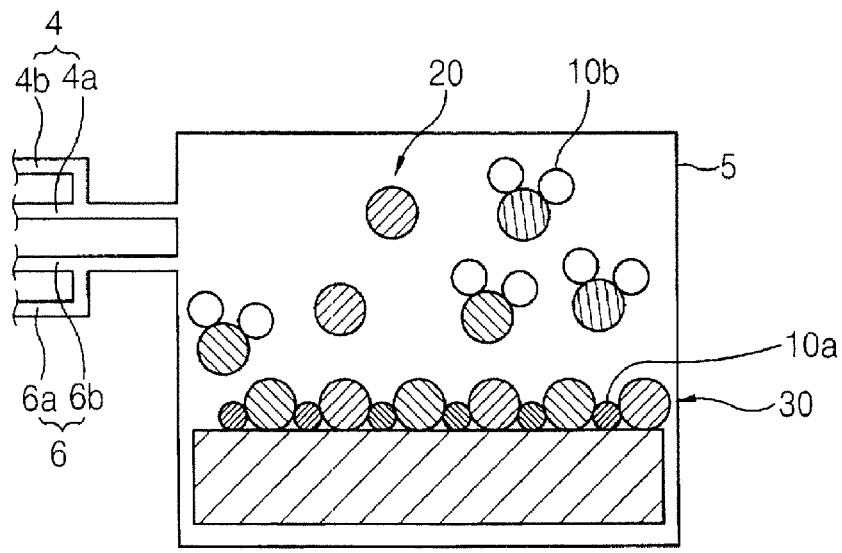

Referring to FIG. 3, an oxidizing agent 20 may be introduced into the chamber 5 through the third branch supply line 6a of the second supply line 6, so that the central metal 10a of the organometallic compound 10 chemisorbed to the substrate 1 may chemically react with the oxidizing agent 20. In some embodiments, the oxidizing agent 20 may be provided to the chamber for a time in a range of about 2 seconds to about 5 seconds.

While the oxidizing agent 20 is provided through the third branch supply line 6a, a backflow prevention gas may be provided into the chamber 5 through the second branch supply line 4b of the first supply line 4. The backflow prevention gas may prevent the oxidizing agent 20 from flowing backward into the first supply line 4.

The central metal 10a may have a relatively high reactivity toward the oxygen atoms, and thus the ligand 10b bonded to the central metal 10a may dissociate, typically rapidly, from the central metal 10a as the central metal 10a chemically reacts with the oxygen atoms. As a result, a metal oxide atomic layer 30 may be formed.

In some embodiments, the oxidizing agent 20 may include a hydroxyl group or an activated oxidizing agent producing an oxygen radical. The activated oxidizing agent may include ozone ($O_3$), plasma oxygen ($O_2$), remote plasma oxygen ($O_2$), and plasma nitrous oxide ($N_2O$) that are formed by a plasma generator. When a portion of oxygen ($O_2$) gas is converted to ozone ($O_3$) gas, a mixed gas of $O_2/O_3$ (e.g., having a mole ratio of about 0.05 to about 0.15) is produced. Furthermore, in some embodiments, the oxidizing agent 20 may include a hydroxyl group included in water vapor ($H_2O$), hydrogen peroxide ($H_2O_2$) gas, and the like, and/or other compounds including oxygen such as nitrous oxide ($N_2O$) gas, nitrogen dioxide ($NO_2$) gas, etc. When ozone gas is used as the oxidizing agent 20 for forming the metal oxide atomic layer 30, the metal oxide atomic layer 30 may have relatively few impurities and may be easy to treat. As such, in particular embodiments, ozone gas is used as the oxidizing agent 20. Ozone may be generated by an ozone generator.

Figure 4:
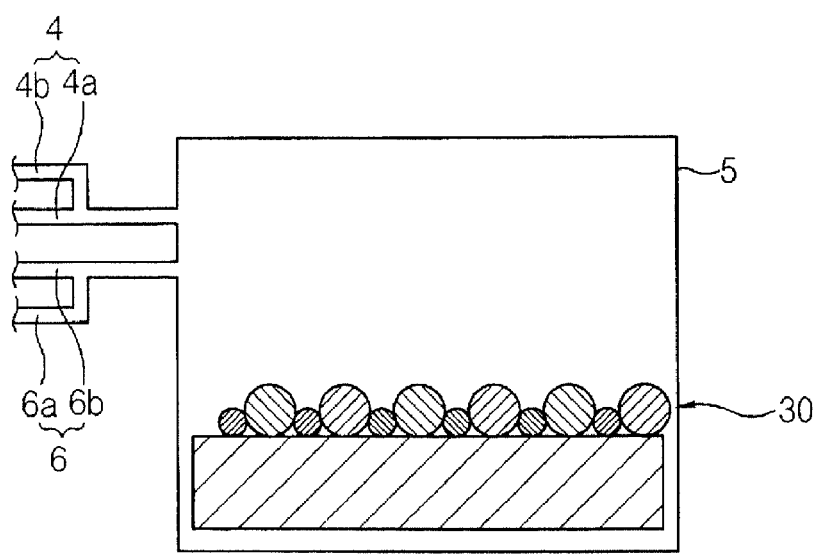

Referring to FIG. 4, an inert gas such as argon, nitrogen, and the like, may be provided to the chamber 5 through the fourth branch supply line 6b of the second supply line 6 to purge the chamber 5, so that any oxidizing agent that has not reacted with the central metal 10a, and the ligand 10b dissociated from the central metal 10a, may be removed from the chamber 5. In some embodiments, the chamber 5 may be purged for a time in a range of about 1 second to about 30 seconds, and in particular embodiments, the chamber 5 may be purged for a time in a range of about 2 seconds to about 20 seconds.

While the purge gas is provided through the fourth branch supply line 6b, a backflow prevention gas may be provided into the chamber 5 through the second branch supply line 4b of the first supply line 4. The backflow prevention gas may prevent the oxidizing agent that has not been reacted with the central metal 10a, and the ligand 10b dissociated from the central metal 10a, from flowing backward into the first supply line 4.

The steps of providing the organometallic compound into the chamber; purging organometallic compound that is not chemisorbed to substrate from the chamber; providing the oxidizing agent into the chamber; and purging dissociated ligand and oxidizing agent that has not reacted with the central metal, may be repeated. In some embodiments, these steps are repeated at least once, and in some embodiments, the steps are performed a plurality of times so that a plurality of the metal oxide atomic layers 30 may be sequentially formed on the substrate 1. Thus, a metal oxide layer having a desired thickness may be formed. For example, the metal oxide layer may include hafnium dioxide ($HfO_2$), zirconium dioxide ($ZrO_2$), titanium dioxide ($TiO_2$), and the like.

In some embodiments of the present invention, a metal oxide layer formed according to an embodiment of the invention may be formed on an aluminum oxide layer (e.g., an aluminum oxide layer formed by an ALD process using an aluminum compound and an oxidizing agent), thereby forming a composite layer.

For example, in some embodiments, an aluminum compound may be introduced into the chamber and chemisorbed to the substrate in the chamber. The aluminum compound may include, for example, trimethyl aluminum (TMA; $Al(CH_3)_3$), triethyl aluminum ($Al(C_2H_5)_3$), triisobutyl aluminum ($Al[(C_2H_3(CH_3)_2]_3$), diethylaluminum chloride ($AlCl(C_2H_5)_3$), and the like. These may be used alone or in any combination thereof.

An exemplary processes for forming the composite layer using TMA as the aluminum compound will now be described.

A purge gas may be provided into the chamber. The purge gas may purge the chamber of methyl groups that have been dissociated from TMA and are drifting in the chamber and/or methyl groups that have physisorbed onto the TMA chemisorbed onto the substrate. Accordingly, a chemisorbed layer including TMA and aluminum (Al) may remain on the substrate.

An oxidizing agent may be introduced into the chamber through the second supply line. Accordingly, oxygen atoms of the oxidizing agent may chemically react with aluminum to form an aluminum oxide. In particular embodiments, ozone gas may be used as the oxidizing agent.

A purge gas may be provided into the chamber through the second supply line to purge the chamber of unreacted reactant and dissociated ligand from the TMA. Accordingly, an aluminum oxide layer may be formed on the substrate.

A metal oxide layer may then be formed on the aluminum oxide layer to complete the composite layer. Any of the methods of forming the metal oxide layer described herein may be used to form one or more metal oxide layers. For example, the composite layer may include $Al_2O_3/HfO_2$, $Al_2O_3/ZrO_2$, or $Al_2O_3/TiO_2$. Such composite layers may have relatively high dielectric constants.

Methods of Forming Gate Structures

FIGS. 5 to 8 are cross-sectional views illustrating methods of forming a gate structure in accordance with some embodiments of the present invention.

Figure 5:
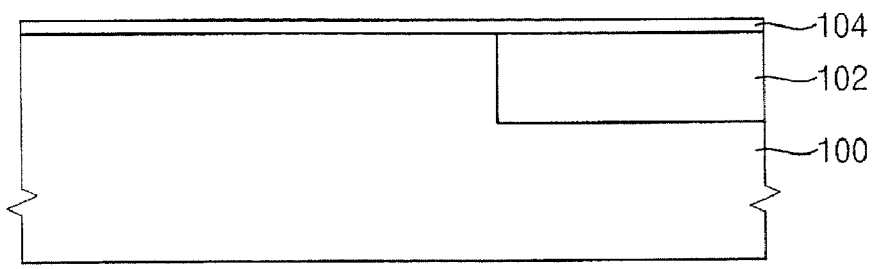
FIGS. 5 to 8 are cross-sectional views illustrating methods of forming a gate structure in accordance with some embodiments of the present invention.

Referring to FIG. 5, an isolation layer 102 may be formed on a substrate 100 to define an active region and a field region. The substrate 100 may include, for example, a silicon substrate, a silicon-on-insulator (SOI) substrate, etc.

A gate insulation layer 104 may be formed on the substrate 100. In some embodiments, the gate insulation layer 104 may have a relatively thin equivalent oxide thickness (EOT) and low current leakage between the gate electrode and a channel. The gate insulation layer 104 having these characteristics may include a metal oxide layer including hafnium oxide, zirconium oxide, titanium oxide, and the like. Additionally, the metal oxide layer may be formed by a method described herein, such as a method described with reference to FIGS. 1 to 4.

As such, an organometallic compound used in forming the gate insulation layer 104 may be expressed by the formula

wherein "M" represents a central metal and "$(NR^1R^2)_3R^3$" represents the ligands. Here, $R^1$ and $R^2$ may each independently be hydrogen or a straight or branched alkyl group. In particular embodiments, $R^1$ and $R^2$ may each independently be hydrogen or an alkyl having one to five carbon atoms ("$C_1$-$C_5$ alkyl"). As such, $R^1$ and $R^2$ may be identical or different from each other. $R^3$ may be alkyl (straight chain or branched), cycloalkyl, heterocycloalkyl, aryl or heteroaryl. In particular embodiments, the alkyl may be a $C_1$-$C_5$ alkyl and the aryl may have 5 or more carbon atoms. Furthermore, the cycloalkyl, heterocycloalkyl, aryl or heteroaryl may be unsubstituted or may be substituted with at least one alkyl group (such as a methyl, ethyl or t-butyl). In some embodiments, each available carbon atom of the cycloalkyl, heterocycloalkyl, aryl or heteroaryl may be substituted. Such an organometallic compound may be relatively thermally and chemically stable and may be relatively insensitive to moisture. Furthermore, such an organometallic compound may be a liquid at room temperature and may be relatively reactive toward oxidation.

In some embodiments of the present invention, the gate insulation layer 104 including a metal oxide may be formed on the substrate 100 by an ALD process according to an embodiment of the invention. A silicon oxide layer (not shown), such as a silicon oxide layer having a thickness of about 5 Å, may be further formed on the gate insulation layer 104. In some embodiments, the silicon oxide layer may be formed in situ after the gate insulation layer 104 including the metal oxide is formed.

Figure 6:
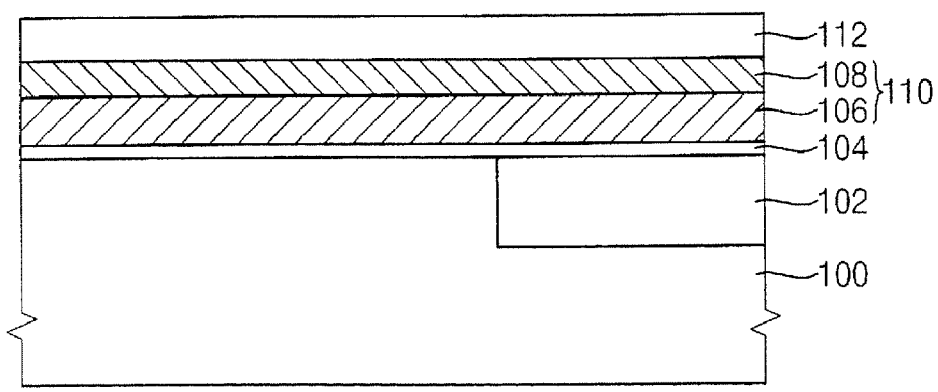

Referring to FIG. 6, a gate conductive layer 110 may be formed on the gate insulation layer 104. In some embodiments of the present invention, the gate conductive layer 110 may have a stacked structure in which a polysilicon layer 106 and a metal silicide layer 108, such as a tungsten silicide layer, are sequentially formed on the gate insulation layer 104. A capping insulation layer 112 (e.g., a layer including a silicon oxide) may be further formed on the gate conductive layer 110.

Figure 7:
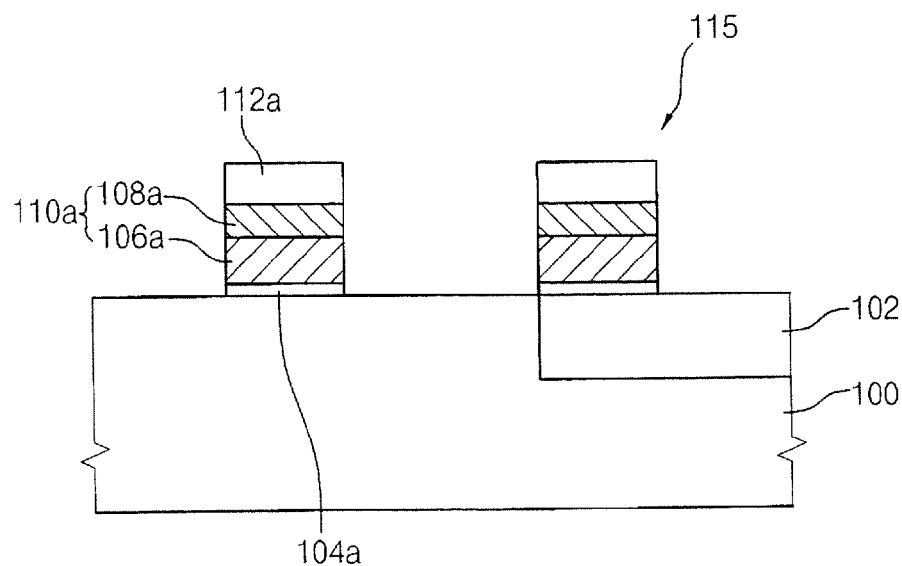

Referring to FIG. 7, the capping insulation layer 112, the gate conductive layer 110 and the gate insulation layer 104 on the substrate 100 may then be sequentially patterned. Accordingly, a gate structure 115 including a gate insulation layer pattern 104a, a gate conductive pattern 110a and a capping insulation layer pattern 112a may be formed on the substrate 100. Patterning for forming the gate structure 115 may be performed by a photolithography process.

Figure 8:
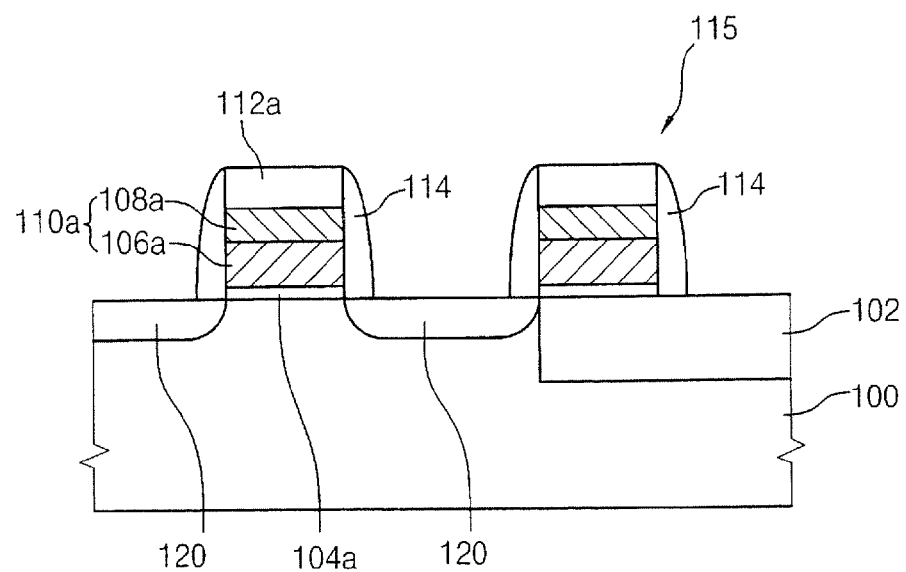

Referring to FIG. 8, a source/drain region 120 may be formed on an upper portion of the substrate 100 adjacent to the gate structure 115. In some embodiments, the source/drain region 120 is formed before or after a spacer 114 is formed on a sidewall of the gate structure 115.

The gate insulation layer pattern 104a of the gate structure 115 may include a metal oxide having a high dielectric constant, such as hafnium oxide, zirconium oxide, titanium oxide, and the like. Accordingly, the gate insulation layer pattern 104a may have desirable step coverage characteristics and may be relatively free of impurities. Furthermore, the gate insulation layer pattern 104a may be relatively thermally and chemically stable. Therefore, the gate insulation layer pattern 104a according to some embodiments of the present invention may have a relatively thin EOT and relatively low current leakage between the gate conductive pattern 110 and the substrate 100.

Methods of Forming Capacitors

FIGS. 9 to 12 are cross-sectional views illustrating methods of forming a capacitor in accordance with some embodiments of the present invention.

Figure 9:
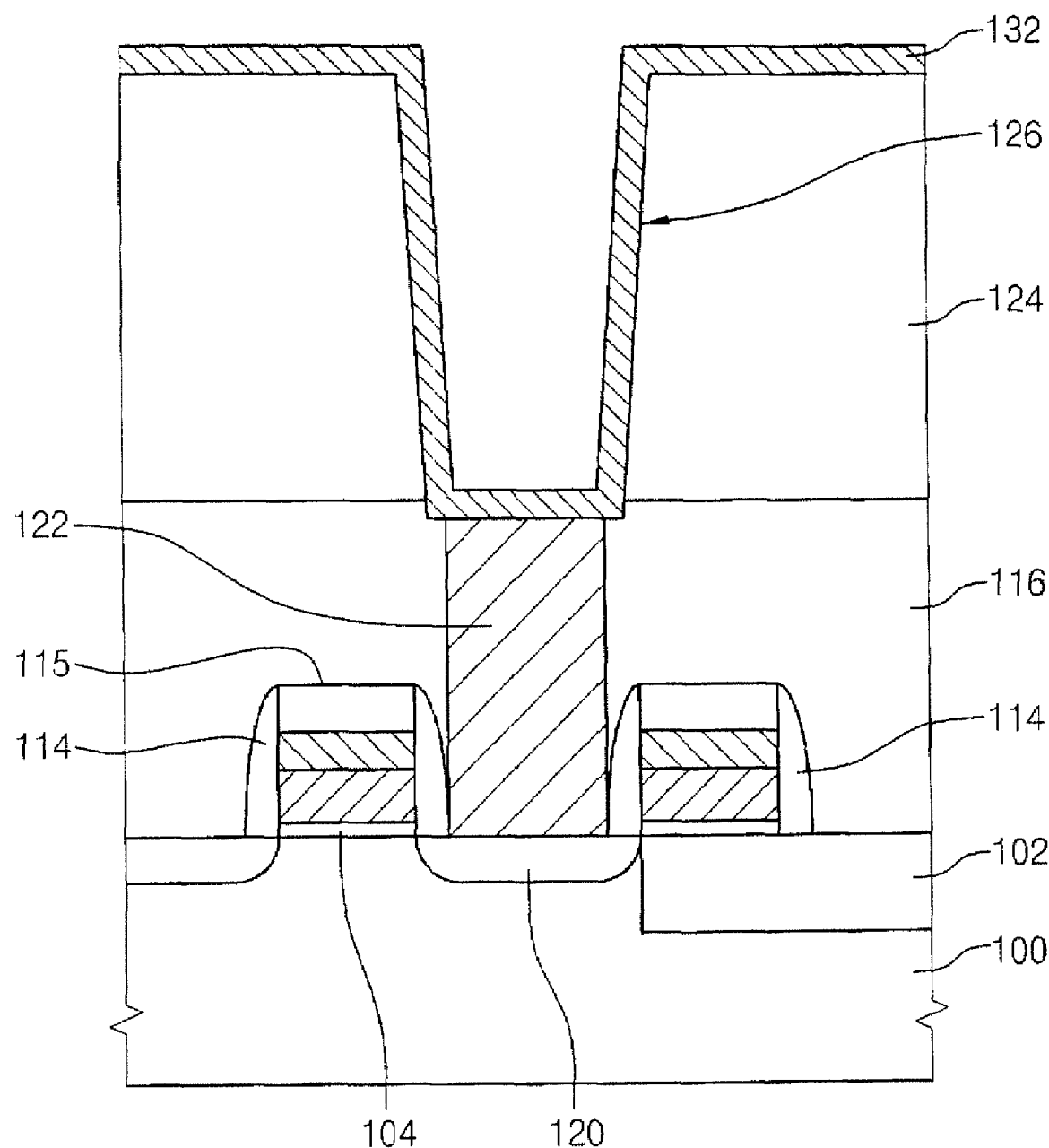
FIGS. 9 to 12 are cross-sectional views illustrating methods of manufacturing a gate structure in accordance with some embodiments of the present invention.

Referring to FIG. 9, after forming a first insulating interlayer 116 covering a gate structure 115 on a substrate 100, on which an isolation layer 102 is formed, the first insulating interlayer 116 may be partially removed to form a first contact hole (not shown) exposing a source/drain region 120 formed at an upper portion of the substrate 100. A spacer 114 may be further formed on a sidewall of the gate structure 115. After forming a first conductive layer filling the first contact hole on the substrate 100 and the first insulating interlayer 116, the first conductive layer may be planarized to form a contact plug 122 filling the first contact hole. After forming a second insulating interlayer 124 on the first insulating interlayer 116 and the contact plug 122, the second insulating interlayer 124 may be partially removed to form a second contact hole 126 exposing the contact plug 122.

A second conductive layer 132 may be formed on the bottom and sidewalls of the second contact hole 126 and the second insulating interlayer 124 to be electrically connected to the contact plug 122. In some embodiments, the second conductive layer 132 may be formed using polysilicon, titanium nitride, tantalum nitride, tungsten nitride, ruthenium, and the like. These may be used alone or in a combination thereof.

Figure 10:
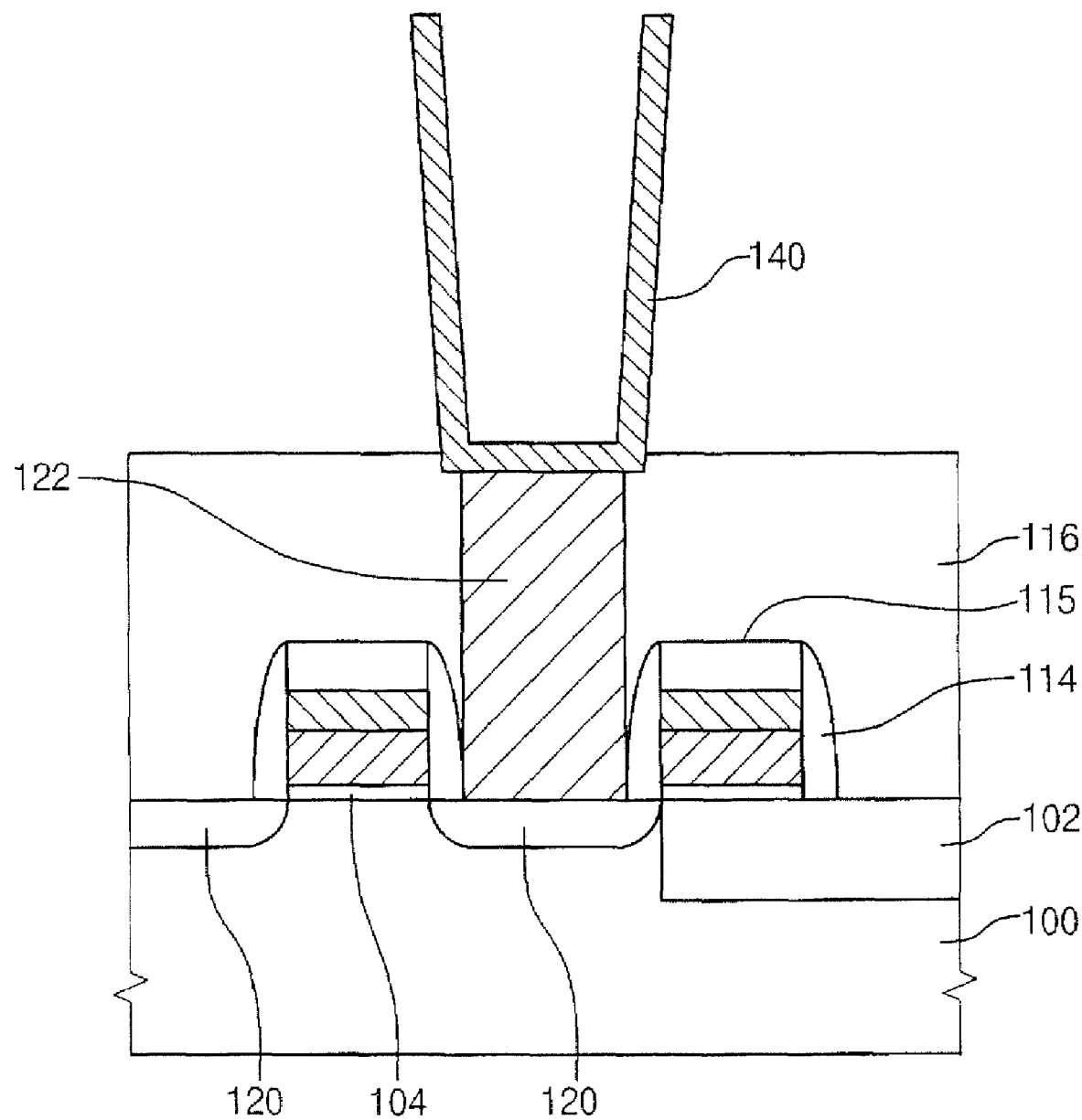

Referring to FIG. 10, a lower electrode 140 electrically connected to the contact plug 122 may be formed. Specifically, a sacrificial layer (not shown) may be formed on the second conductive layer 132 (see FIG. 9), and an upper portion of the sacrificial layer may be removed until the second conductive layer 132 is exposed. A portion of the second conductive layer 132 on the second insulating interlayer 124 may be removed to form the lower electrode 140 on the bottom and the sidewall of the contact hole 126. The sacrificial layer and the second insulating interlayer 124 may then be removed. In some embodiments, the lower electrode 140 may have a cylindrical shape in which a width of a top portion is larger than that of a bottom portion.

Figure 11:
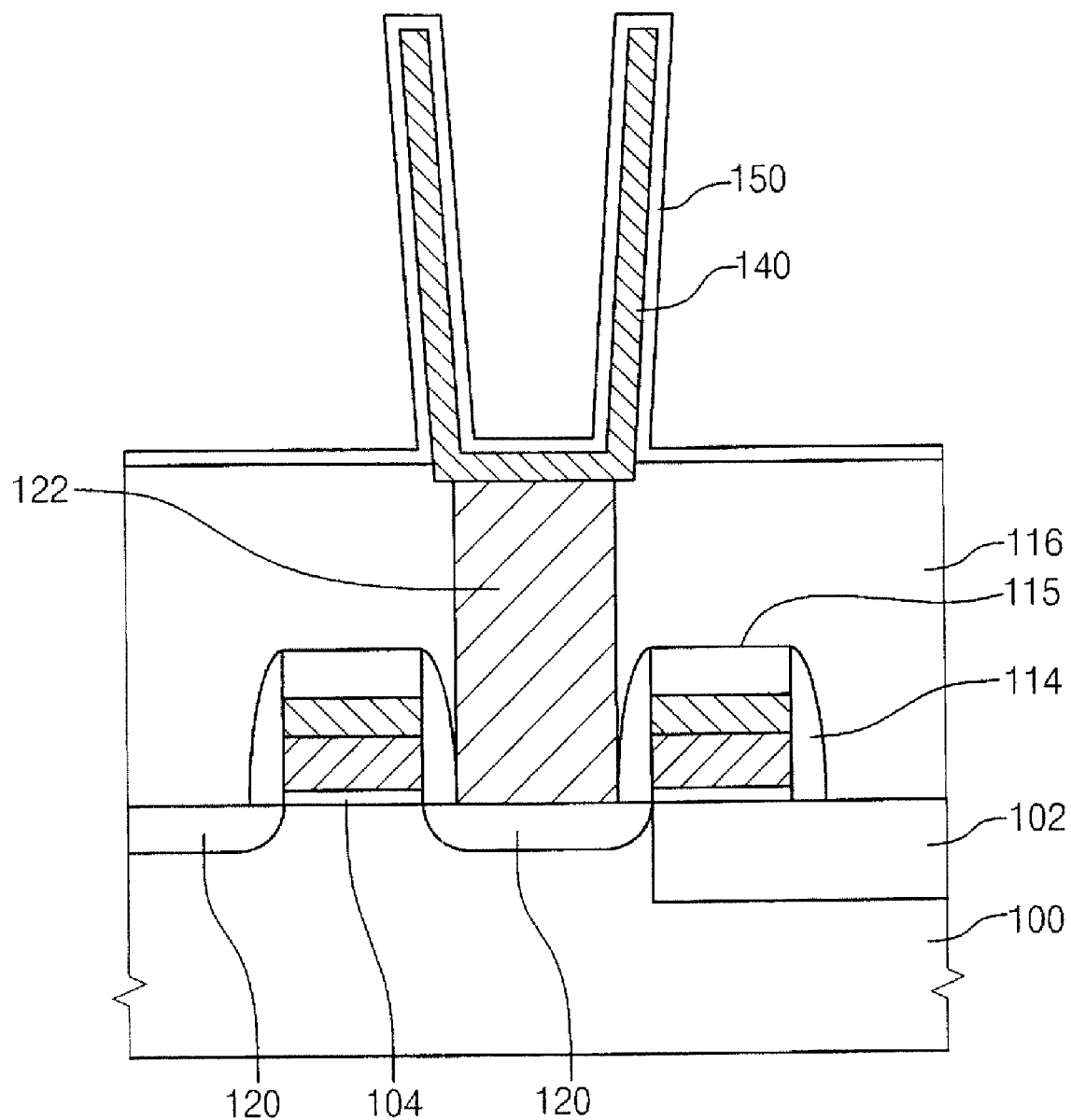

Referring to FIG. 11, a dielectric layer 150 may be formed on the lower electrode 140 and the first insulating interlayer 116. The dielectric layer 150 may be formed using a metal oxide such as hafnium oxide, titanium oxide, zirconium oxide, etc. The dielectric layer 150 including such a material may have a relatively thin EOT a relatively high dielectric constant and a relatively low leakage current between the lower electrode 140 and an upper electrode 160 (see FIG. 12).

As such, an organometallic compound used in forming the dielectric layer 150 may be expressed by the formula

$$M(NR^1R^2)_3R^3$$

wherein "M" represents a central metal and "$(NR^1R^2)_3R^3$" represents the ligands. Here, $R^1$ and $R^2$ may each independently be hydrogen or a straight or branched alkyl group. In particular embodiments, $R^1$ and $R^2$ may each independently be hydrogen or an alkyl having one to five carbon atoms ("$C_1$-$C_5$ alkyl"). As such, $R^1$ and $R^2$ may be identical or different from each other. $R^3$ may be alkyl (straight chain or branched), cycloalkyl, heterocycloalkyl, aryl or heteroaryl. In particular embodiments, the alkyl may be a $C_1$-$C_5$ alkyl and the aryl may have 5 or more carbon atoms. Furthermore, the cycloalkyl, heterocycloalkyl, aryl or heteroaryl may be unsubstituted or may be substituted with at least one alkyl group (such as a methyl, ethyl or t-butyl). In some embodiments, each available carbon atom of the cycloalkyl, heterocycloalkyl, aryl or heteroaryl may be substituted. Such an organometallic compound may be relatively thermally and chemically stable and may be relatively insensitive to moisture. Furthermore, such an organometallic compound may be a liquid at room temperature and may be relatively reactive toward oxidation. Additionally, the dielectric layer may be formed by a method described herein, such as a method described with reference to FIGS. 1 to 4.

Figure 12:
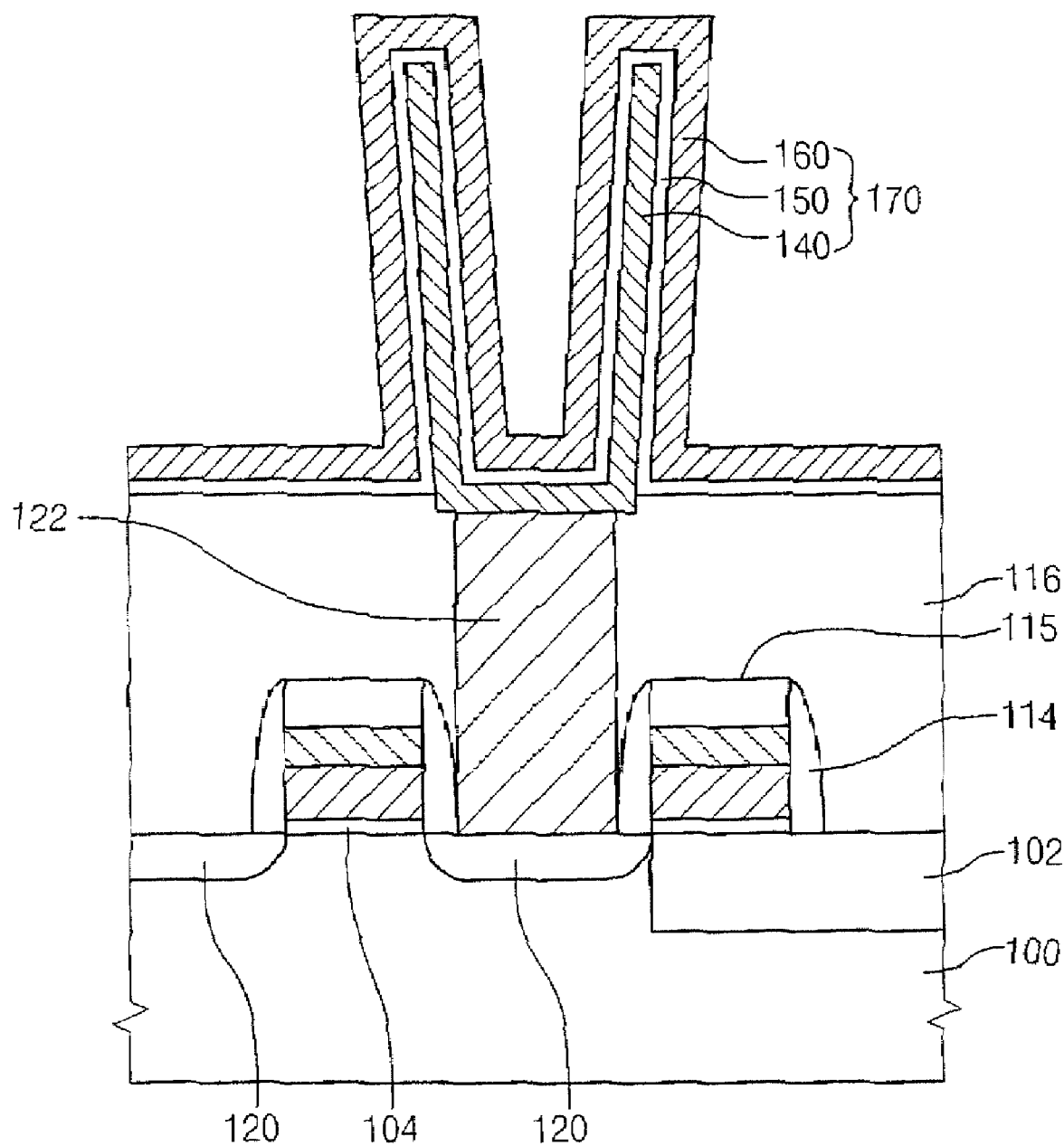

Referring to FIG. 12, a heat treatment process may be performed on the dielectric layer 150 so that contaminants on or in the dielectric layer 150 may be removed and oxygen defects may be recovered. For example, the heat treatment process may include an ultraviolet ozone (UV-$O_3$) treatment, a plasma treatment, etc.

The upper electrode 160 may be formed on the dielectric layer 150. The upper electrode 160 may be formed, for example, using polysilicon, titanium nitride, tantalum nitride, tungsten nitride, ruthenium, and the like. These may be used alone or in any combination thereof.

Accordingly, a capacitor 170 comprising the lower electrode 140, the dielectric layer 150 including a metal oxide, and the upper electrode 160 may be formed on the substrate 100.

The dielectric layer 150 may be formed using a metal oxide having a relatively high dielectric constant, so that the capacitor, in some example embodiments of the present invention, may be relatively thermally and chemically stable and may have a relatively high capacitance.

Hereinafter, the present invention will be described in further detail by reference to the example embodiments and comparative examples. However, the scope of the present invention is not limited to the example embodiments, and it will be appreciated that many variations, modifications and other applications of the present invention may be made.

EXAMPLE 1

A substrate was placed in a chamber, and then the chamber was evacuated to vacuum pressure. The temperature in the chamber was maintained at about 340° C. CpHf(NEtMe)$_3$ used as a precursor was maintained in a liquid state and heated to a temperature of about 80° C. Argon gas used as a carrier gas was provided into the chamber at a flow rate of about 1,000 sccm while CpHf(NEtMe)$_3$ was provided into the chamber at a flow rate of about 100 sccm for about 0.1 seconds. Then, nitrogen gas was provided for about 3 seconds to purge the chamber. Next, ozone gas was provided into the chamber, and nitrogen gas was provided to purge the chamber. A unit cycle including providing the precursor into the chamber, purging the chamber, providing ozone gas into the chamber and purging the chamber was repeatedly performed to form a hafnium oxide layer.

EXAMPLE 2

An ALD process substantially the same as that described in Example 1, except that CpZr(NEtMe)$_3$ was used as the precursor, was performed to form a zirconium oxide layer.

COMPARATIVE EXAMPLE 1

An ALD process substantially the same as that described in Example 1, except that Hf(NEtMe)$_4$ was used as the precursor, was performed to form a hafnium oxide layer.

COMPARATIVE EXAMPLE 2

An ALD process substantially the same as that described in Example 1, except that Zr(NEtMe)$_4$ was used as the precursor, was performed to form a zirconium oxide layer.

Evaluation of Thermal Stability of Particular Organometallic Compounds

To evaluate the thermal stability of organometallic compounds, 10 g of conventional Zr(NEtMe)$_4$ and 10 g of CpZr(NEtMe)$_3$ were each added to respective 250 mL flasks, and each flask was heated in an oil bath at a temperature of about 130° C. for 4 hours. After 4 hours, residues were observed with the naked eye and analyzed by hydrogen nuclear magnetic resonance ($^1$H NMR) at each time (0 h, 4 h, 18 h, 24 h, 48 h) while removing any evaporated source gas by vacuum.

Whether the organometallic compounds discolor and whether particles are generated may be ascertained with the naked eye, and thus the structural stability of conventional Zr(NEtMe)$_4$ and CpZr(NEtMe)$_3$, a precursor used according to some embodiments of the invention, as a function of heating time may be confirmed with the naked eye.

When Zr(NEtMe)$_4$ was used as the organometallic compound, fumes were produced as Zr(NEtMe)$_4$ was heated at a temperature of about 130° C. Additionally, the mass of Zr(NEtMe)$_4$ was gradually reduced and the Zr(NEtMe)$_4$ was discolored to black as the flask was evacuated. After 18 hours, the mass of the Zr(NEtMe)$_4$ was not changed and particles were generated by thermal decomposition. Furthermore, the Zr(NEtMe)$_4$ was now a sticky liquid and discolored to black. In contrast, CpZr(NEtMe)$_3$ was discolored after 18 hours in a vacuum after CpZr(NEtMe)$_3$ was heated at a temperature of about 130° C. Particles were not generated. Therefore, CpZr(NEtMe)$_3$ appeared to be less chemically altered by heat and may be considered relatively thermally stable.

The structure of an organic or an inorganic compound may be analyzed by $^1$H NMR spectroscopy. Thus, whether an organometallic compound decomposes as a function of heating time may be ascertained by measuring variations in the H$^1$ NMR spectra. For example, the change in the H$^1$ NMR of the methyl groups of the organometallic compounds, namely Zr(NEtMe)$_4$ and CpZr(NEtMe)$_3$, may indicate structural changes in the compounds.

Figure 13:
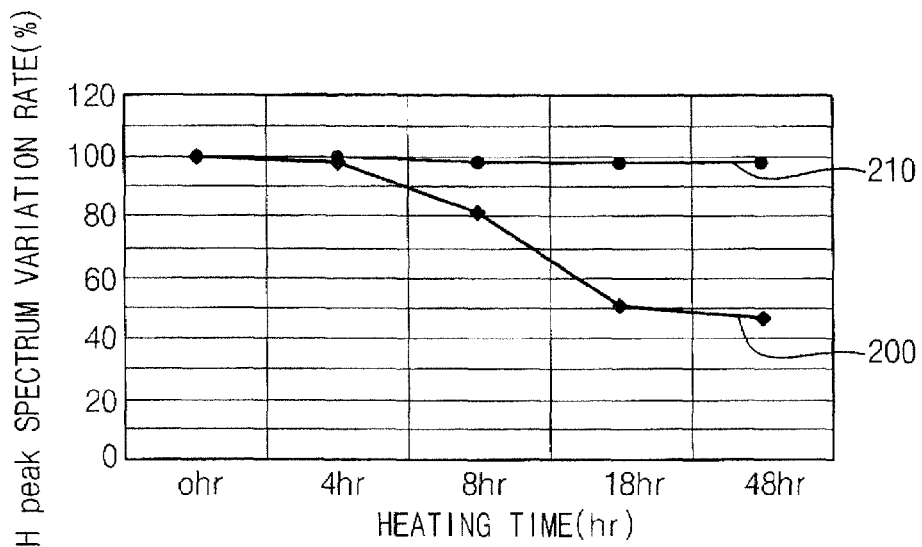
FIG. 13 is a graph illustrating the variation in the hydrogen nuclear magnetic resonance ($^1$H NMR) signal from the hydrogen atoms on the methyl groups in $CpZr(NEtMe)_3$ and conventional $Zr(NEtMe)_4$, as a function of heating time.

FIG. 13 is a graph showing the change in the hydrogen peaks for CpZr(NEtMe)$_3$ and Zr(NEtMe)$_4$, as analyzed by the $^1$H NMR, as a function of heating time. Referring to FIG. 13, reference numeral 200 indicates the intensity of the H$^1$ NMR peak for the methyl group (2.97 ppm) in Zr(NEtMe)$_4$, and reference numeral 210 indicates the intensity of the H$^1$ NMR peak for the methyl group (2.87 ppm) in CpZr(NEtMe)$_3$. After 48 hours, the intensity of the H$^1$ NMR peak 200 of the Zr(NEtMe)$_4$ was reduced to about 46.2% compared to the initial intensity. However, the intensity of the H$^1$ NMR peak 210 of the CpZr(NEtMe)$_3$ was only reduced to about 97.5% compared to the initial intensity. This data provides additional evidence that CpZr(NEtMe)$_3$ may be relatively thermally stable at a temperature of about 130° C.

Evaluation of the Evaporation Temperature of CpZr(NEtMe)$_3$

Figure 14:
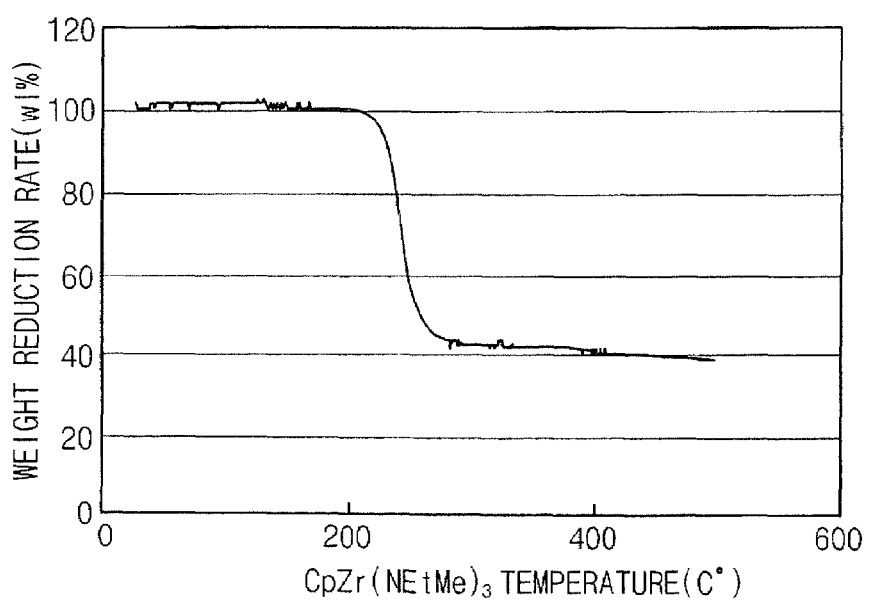
FIG. 14 is a graph illustrating the results of a thermogravimetric analysis (TGA) of $CpZr(NEtMe)_3$.

FIG. 14 is a graph showing the results of a thermogravimetric analysis (TGA) of CpZr(NEtMe)$_3$.

In TGA, the weight variation of a sample as a function of time and temperature is recorded and a thermal decomposition curve may be drawn as the temperature either remains constant or increases at a constant rate, and thus the weight change due to thermal decomposition, sublimation, evaporation and oxidation may be analyzed by the thermal decomposition curve. Thus, whether the structure of the compound is affected by heat may be confirmed by measuring the rate of weight decrease as the compound is heated, thereby measuring the thermal stability of the compound.

Figure 15:
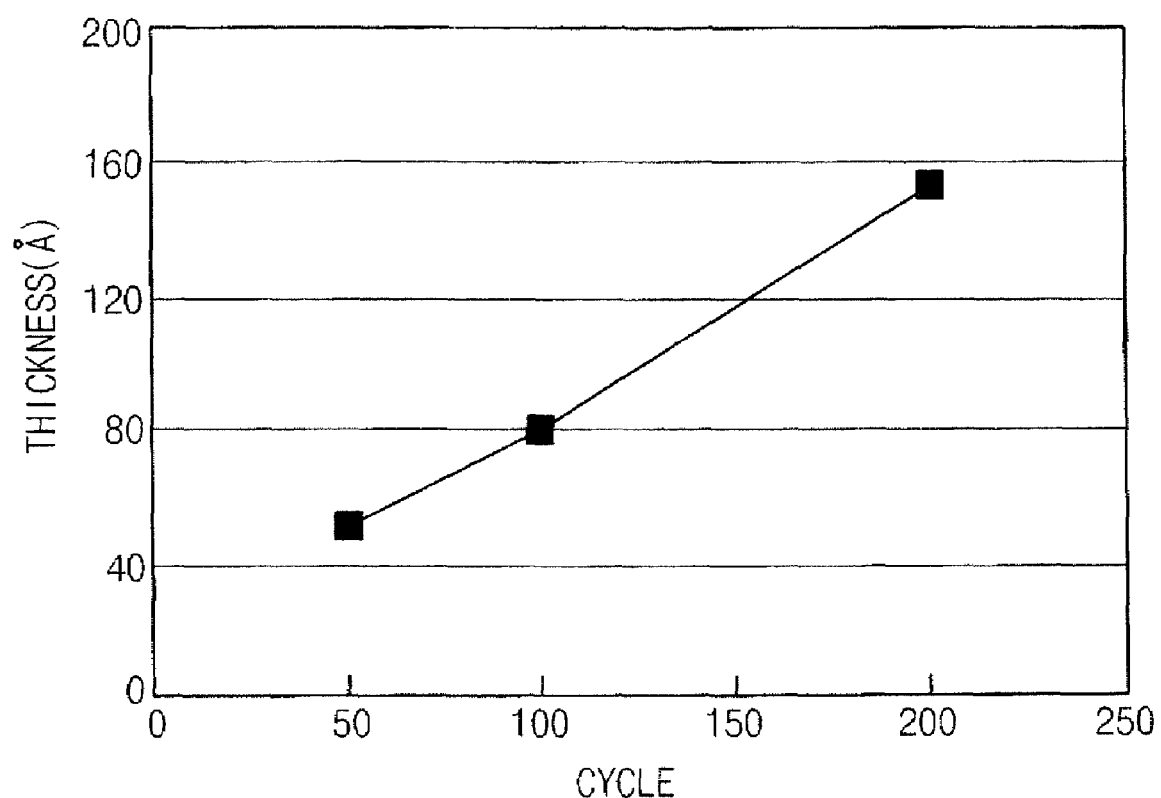
FIG. 15 is a graph illustrating the deposition thickness as a function of the number of cycles for a layer formed by an atomic layer deposition (ALD) process using $CpZr(NEtMe)_3$ as the precursor.

In a TGA for CpZr(NEtMe)$_3$, the temperature was increased at a rate of 10° C./min, as shown in FIG. 15. Referring to FIG. 14, the weight begins to decrease at a temperature of about 210° C., and then levels out at a temperature of about 280° C. and remains relatively constant until about 500° C. Thus, CpZr(NEtMe)$_3$ evaporates at a temperature of about 210° C. to about 280° C., and CpZr(NEtMe)$_3$ is thermally suitable for an ALD process that is generally performed at a temperature under about 500° C.

Evaluation of the Thickness of a Layer as a Function of Number of Cycles of an ALD Process The thickness of a hafnium oxide layer formed by the ALD process performed in Example 1 as a function of the number of deposition cycles was measured.

FIG. 15 is a graph showing the deposition thickness at each cycle when the hafnium layer was formed by the ALD process using CpHf(NEtMe)$_3$ in accordance with the procedure described in Example 1.

Referring to FIG. 15, the deposition thickness linearly increases with the number of cycles, and the deposition rate is about 0.7 Å/cycle. Thus, CpHf(NEtMe)$_3$ may serve as an organometallic precursor in an ALD process.

Evaluation of Step Coverage of a Metal Oxide Layer

When a dielectric layer of a capacitor was formed by the ALD process of Example 1, the step coverage of the dielectric layer was evaluated. Particularly, a hafnium oxide layer was formed on an insulation layer covering a lower electrode and having a hole therethrough. The hafnium oxide layer was formed on the insulation layer and a bottom surface and sidewalls of a hole having an aspect ratio of about 10:1 with an exposed lower electrode. The step coverage of the hafnium oxide layer was analyzed using a transmission electron microscope (TEM). Here, the "step coverage" means the ratio of the thickness of a hafnium oxide layer on the bottom of the hole to the thickness of a hafnium oxide on the insulation layer. The hafnium oxide layer formed using CpHf(NEtMe)$_3$ in accordance with Example 1 was evaluated to have a relatively high step coverage of about 75% to about 80%, and thus may be used as a dielectric layer of a cylindrical capacitor.

Evaluation of the Change in Organometallic Precursor in Canister

Precursors that were not used in an ALD process and precursors that were used in ALD processes for about three months in canisters in accordance with Example 2 and Comparative Example 2, respectively, were observed with the naked eye and analyzed by ultraviolet-visible (UV-Vis) spectroscopy, and changes of the precursors were evaluated. Particularly, CpZr(NEtMe)$_3$ and Zr(NEtMe)$_4$, which were precursors described in Example 2 and Comparative Example 2, respectively, were contained in canisters that were maintained at a temperature of about 80° C., and ALD processes were performed for three months. After three months, the precursors remaining in the canisters were observed with the naked eye and inspected by the UV-Vis spectroscopy.

As observed by the naked eye, Zr(NEtMe)$_4$ was discolored from pale yellow to dark brown by thermal decomposition. However, CpZr(NEtMe)$_3$ was not discolored even after three months.

Figure 16:
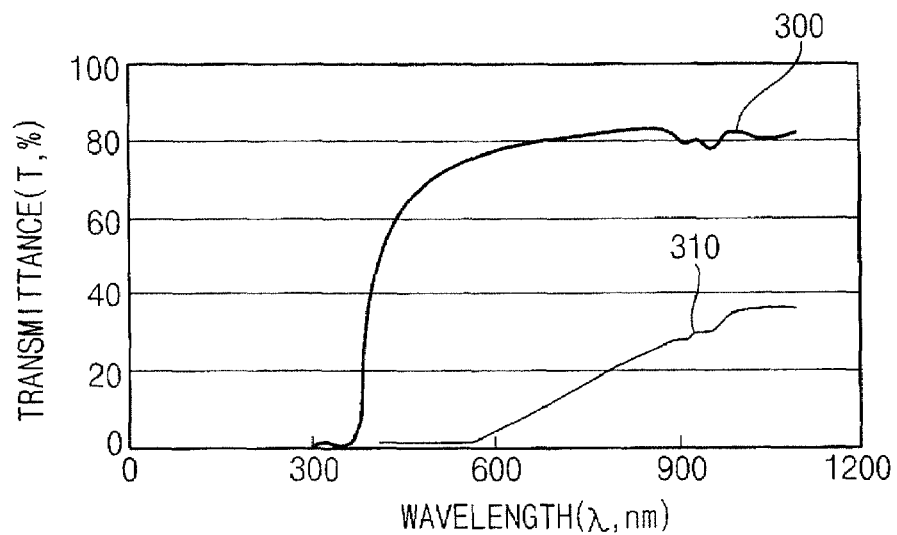
FIG. 16 is an ultraviolet-visible (UV-Vis) spectra of conventional $Zr(NEtMe)_4$ measured before and after an ALD process was performed for three months.
Figure 17:
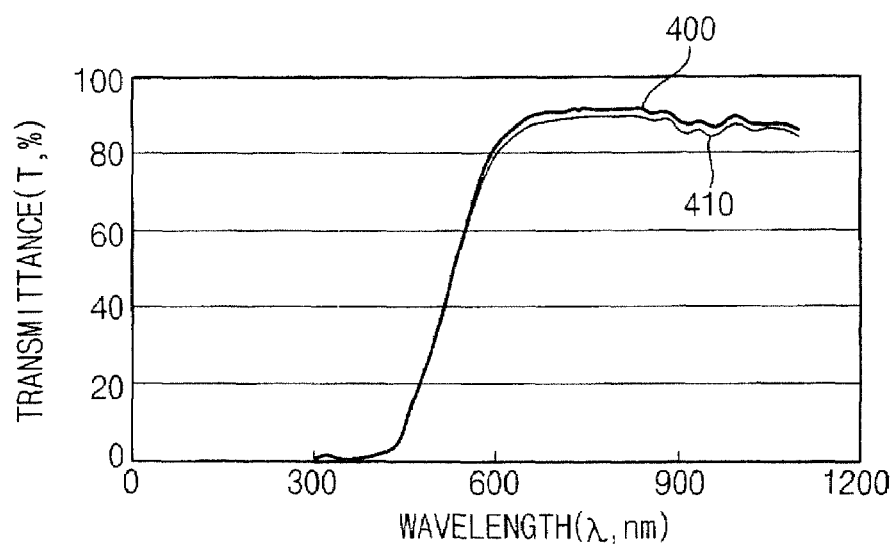
FIG. 17 is a UV-Vis spectra of $CpZr(NEtMe)_3$ measured before and after an ALD process was performed for three months.

FIG. 16 is a graph showing UV-Vis spectra of the remaining precursor in the canister measured before and after an ALD process was performed, respectively, in accordance with Comparative Example 2. FIG. 17 is a graph showing UV-Vis spectra of the remaining precursor in a canister measured before and after the ALD process was performed, respectively, in accordance with Example 2.

The light transmission of a compound may be measured using UV-Vis spectroscopy. For example, the light transmission of the compound may be measured by analyzing the wavelength of a light absorbed by the compound or the degree to which the compound absorbs light in a wavelength range of about 200 nm to about 800 nm.

Referring to FIGS. 16 and 17, light transmission 310 of Zr(NEtMe)$_4$ after ALD processes was performed for three months was reduced by about 66% to about 95% compared to a light transmission 300 of the Zr(NEtMe)$_4$ before the ALD processes were performed. In contrast, light transmission 410 of CpZr(NEtMe)$_3$ after an ALD process was performed in accordance with an embodiment of the present invention was reduced by only about 2% compared to a light transmission 400 of the CpZr(NEtMe)$_3$ before the ALD process was performed. That is, the light transmission of the organometallic compound in accordance with an embodiment of the present invention was not significantly altered, even though the organometallic compound was maintained at a temperature of about 80° C. for three months. Therefore, such an organometallic compound may be acknowledged to substantially retain its chemical structure and have relatively good thermal stability.

The above example embodiments have described only HfO$_2$ and ZrO$_2$; however, the ALD process in accordance with the present invention may be applicable to any metal oxide including a metal in Group 4 of the periodic table.

According to some embodiments of the present invention, an organometallic compound that is relatively thermally and chemically stable compared, e.g., relative to conventional tetrakis ethylmethylamino hafnium (TEMAH, Hf[N(CH$_3$)(C$_2$H$_5$)]$_4$) or tetrakis ethylmethylamino zirconium (TEMAZ, Zr[N(CH$_3$)(C$_2$H$_5$)]$_4$), may be used as a metal precursor of an ALD process for forming a metal oxide layer, so that the metal oxide layer may have a relatively high dielectric constant, relatively good step coverage characteristics and relatively low impurity content. Thus, the metal oxide layer may be used in forming a gate insulation layer of a gate structure, a dielectric layer of a capacitor, a dielectric layer of a flash memory device, etc.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a metal oxide layer, comprising:
providing an organometallic compound to a substrate; and
providing an oxidizing agent to the substrate to form the metal oxide layer on the substrate,
wherein the organometallic compound has the formula

$M(NR^1R^2)_3R^3$ wherein M is a metal;
$R^1$ and $R^2$ are each independently hydrogen or alkyl; and
$R^3$ is selected from the group consisting of alkyl, cycloalkyl, heterocycloalkyl, aryl and heteroaryl.

2. The method of claim 1, wherein
$R^1$ and $R^2$ are each independently hydrogen or C$_1$-C$_5$ alkyl, and
$R^3$ is selected from the group consisting of C$_1$-C$_5$ alkyl, heterocycloalkyl, aryl and heteroaryl, wherein the heterocycloalkyl, aryl or heteroaryl is unsubstituted or substituted at least one of a methyl, ethyl and/or t-butyl.

3. The method of claim 1, wherein the organometallic compound comprises at least one compound selected from the group consisting of CpZr(N(CH$_3$)(C$_2$H$_5$))$_3$, CpHf(N(CH$_3$)(C$_2$H$_5$))$_3$ and CpTi(N(CH$_3$)(C$_2$H$_5$))$_3$.

4. The method of claim 1, wherein the oxidizing agent comprises at least one oxidizing agent selected from the group consisting of ozone, plasma O$_2$, remote plasma O$_2$, plasma N$_2$O and H$_2$O.

5. The method of claim 1, wherein the metal oxide comprises at least one metal oxide selected from the group consisting of TiO$_2$, ZrO$_2$, and HfO$_2$.

6. A method of forming a metal oxide layer, comprising:
(i) providing an organometallic compound to a substrate;
(ii) chemisorbing at least a portion of the organometallic compound to the substrate;
(iii) removing any organometallic compound that is not chemisorbed to the substrate;
(iv) providing an oxidizing agent to the substrate;
(v) chemically reacting the organometallic compound with the oxidizing agent, thereby dissociating at least one ligand from the organometallic compound and forming the metal oxide layer; and
(vi) removing unreacted oxidizing agent and dissociated ligand from the substrate,
wherein the organometallic compound has the formula of $M(NR^1R^2)_3R^3$ wherein M is a metal;

$R^1$ and $R^2$ are each independently hydrogen or alkyl; and $R^3$ is selected from the group consisting of alkyl, cycloalkyl, heterocycloalkyl, aryl and heteroaryl.

7. The method of claim 6, wherein $R^1$ and $R^2$ are each independently hydrogen or $C_1$-$C_5$ alkyl, and $R^3$ is selected from the group consisting of $C_1$-$C_5$ alkyl, heterocycloalkyl, aryl and heteroaryl, wherein the heterocycloalkyl, aryl or heteroaryl is unsubstituted or substituted at least one of a methyl, ethyl and/or t-butyl.

8. The method of claim 6, wherein the steps of providing the organometallic compound to the substrate and providing the oxidizing agent to the substrate are each performed at a temperature in a range of about 200° C. to about 400° C. and at a pressure in a range of about 0.1 torr to about 10 torr.

9. The method of claim 6, wherein providing the organometallic compound to the substrate comprises providing a carrier gas and the organometallic compound to the substrate.

10. The method of claim 6, wherein the organometallic compound is at a temperature in a range of about 40° C. to about 120° C. prior to being provided to the substrate.

11. The method of claim 6, wherein the steps of removing any organometallic compound that is not chemisorbed to the substrate and removing unreacted oxidizing agent and dissociated ligand from the substrate both comprise providing an inert gas to the substrate.

12. The method of claim 6, further comprising performing a heat treatment process in an oxygen atmosphere to the substrate after removing unreacted oxidizing agent and dissociated ligand from the substrate.

13. The method of claim 12, wherein the aluminum compound comprises at least one compound selected from the group consisting of trimethyl aluminum, triethyl aluminum, triisobutyl aluminum and diethylaluminum chloride.

14. The method of claim 6, wherein steps (i) through (vi) are repeated at least once.

15. The method of claim 6, further comprising forming an aluminum oxide layer on the substrate prior to providing the organometallic compound to the substrate, wherein forming an aluminum oxide layer comprises providing an aluminum compound and an oxidizing agent.

16. A method of forming a gate structure, comprising:

providing an organometallic compound to a substrate; and providing an oxidizing agent to the substrate to form a gate insulation layer comprising a metal oxide;

forming a gate conductive layer on the gate insulation layer; and patterning the gate conductive layer and the gate insulation layer to form the gate structure comprising a gate insulation layer pattern and a gate conductive layer pattern on the substrate, wherein the organometallic compound has the formula of $M(NR^1R^2)_3R^3$ wherein M is a metal;

$R^1$ and $R^2$ are each independently hydrogen or alkyl; and $R^3$ is selected from the group consisting of alkyl, cycloalkyl, heterocycloalkyl, aryl and heteroaryl.

17. The method of claim 16, wherein $R^1$ and $R^2$ are each independently hydrogen or $C_1$-$C_5$ alkyl, and $R^3$ is selected from the group consisting of $C_1$-$C_5$ alkyl, heterocycloalkyl, aryl and heteroaryl, wherein the heterocycloalkyl, aryl or heteroaryl is unsubstituted or substituted at least one of a methyl, ethyl and/or t-butyl.

18. A method of forming a capacitor, comprising:

forming a lower electrode on a substrate;

providing an organometallic compound to the lower electrode;

providing an oxidizing agent to the lower electrode to form a dielectric layer comprising a metal oxide; and forming an upper electrode on the dielectric layer, wherein the organometallic compound has the formula of $M(NR^1R^2)_3R^3$ wherein M is a metal;

$R^1$ and $R^2$ are each independently hydrogen or alkyl; and $R^3$ is selected from the group consisting of alkyl, cycloalkyl, heterocycloalkyl, aryl and heteroaryl.

19. The method of claim 18, wherein $R^1$ and $R^2$ are each independently hydrogen or $C_1$-$C_5$ alkyl, and $R^3$ is selected from the group consisting of $C_1$-$C_5$ alkyl, heterocycloalkyl, aryl and heteroaryl, wherein the heterocycloalkyl, aryl or heteroaryl is unsubstituted or substituted at least one of a methyl, ethyl and/or t-butyl.

* * * * *